(12) United States Patent
Kandah et al.

(10) Patent No.: US 7,929,266 B2
(45) Date of Patent: Apr. 19, 2011

(54) ELECTRONIC DEVICE OPERABLE TO PROTECT A POWER TRANSISTOR WHEN USED IN CONJUNCTION WITH A TRANSFORMER

(75) Inventors: Ibrahim Kandah, Canton, MI (US); Shiraz J. Contractor, Phoenix, AZ (US); William E. Edwards, Ann Arbor, MI (US); Randall C. Gray, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 689 days.

(21) Appl. No.: 11/960,154

(22) Filed: Dec. 19, 2007

(65) Prior Publication Data

US 2009/0161287 A1    Jun. 25, 2009

(51) Int. Cl.
*H02H 3/00*    (2006.01)
(52) U.S. Cl. .............. 361/78; 361/56; 361/86; 361/91.1
(58) Field of Classification Search .................. 361/263; 323/265; 327/318
See application file for complete search history.

(56) References Cited

U.S. PATENT DOCUMENTS

| | | | | |
|---|---|---|---|---|
| 4,114,582 A | * | 9/1978 | Rabus et al. | 123/650 |
| 5,506,478 A | * | 4/1996 | Daetz | 315/209 T |
| 5,623,912 A | * | 4/1997 | Kelly | 123/644 |
| 5,636,097 A | * | 6/1997 | Palara et al. | 361/101 |
| 6,142,130 A | * | 11/2000 | Ward | 123/606 |
| 6,545,478 B2 | * | 4/2003 | Torres | 324/380 |
| 7,450,354 B2 | * | 11/2008 | Tain et al. | 361/18 |
| 2006/0006851 A1 | | 1/2006 | Thiery | |
| 2006/0152865 A1 | * | 7/2006 | Nair et al. | 361/35 |

OTHER PUBLICATIONS

B. Van Zeghbroeck, Power MOSFETs, Principles of Semiconductor Devices, pp. 1-6, copyright 2004.
B. Van Zeghbroeck, Bipolar Power Devices, Principles of Semiconductor Devices, pp. 1-5, copyright 2004.

\* cited by examiner

*Primary Examiner* — Jared J Fureman
*Assistant Examiner* — Terrence R Willoughby

(57) ABSTRACT

An electronic device can be used with a system, such as an ignition system, that operates a relatively high voltage. The device can include a signal clamping control module that can include a signal reference module and a feedback control module. The signal reference module is operable to provide a reference signal to the feedback control module. The feedback control can be configured to receive a scaled signal from a signal scaling module, wherein the scaled signal is representative of a signal at a current carrying electrode of a power transistor. Based on the comparison of the reference signal to the scaled signal, the measurement module provides one or more signals to a control signal drive module. The feedback control module provides a control electrode signal to a control electrode of the power transistor.

20 Claims, 7 Drawing Sheets

ELECTRONIC DEVICE OPERABLE TO PROTECT A POWER TRANSISTOR WHEN USED IN CONJUNCTION WITH A TRANSFORMER

BACKGROUND

1. Field of the Disclosure

The present disclosure relates to electronic devices and systems including and methods of using the same, and more particularly to electronic devices that includes signal clamping control modules to clamp voltages of power transistors, and systems including and method of using the same.

2. Description of the Related Art

Internal combustion engines typically include an ignition system, such as a conventional ignition system 10 in FIG. 1. The circuit for the ignition system can include a battery 12 that is coupled to a primary winding 142 of a transformer 14, such as an ignition coil, the primary winding is coupled to a collector of an insulated gate bipolar transistor 16. A control signal can be provided to the gate of the insulated gate bipolar transistor 16 to affect current flow between the collector and emitter of the insulated gate bipolar transistor 16. The control signal may be provided from an integrated circuit or another part of a vehicle having the internal combustion engine. The emitter of the insulated gate bipolar transistor 16 and the battery are coupled together and to a ground terminal. A secondary winding 144 of the transformer 14 has one terminal coupled to ground or a terminal of a battery and another terminal that produces a higher voltage signal that may be coupled to a spark plug or other ignition element.

The collector of the insulated gate bipolar transistor 16 can reach very high voltages during operation of the ignition system 10. For example, the collector may reach up to 400 volts or potentially higher during normal operation of the ignition system 10. The insulated gate bipolar transistor 16 is designed with an internal self-protection voltage clamp that is activated when the voltage difference between the collector and emitter exceeds 400 volts. At this point, the current flows between the collector and emitter of the insulated gate bipolar transistor, and the energy in the transformer is dissipated.

Because the insulated gate bipolar transistor 16 is designed to allow up to 400 volts between the collector and emitter and has an internal high-voltage clamping mechanism therein, the design of the insulated gate bipolar transistor 16 is relatively complicated. Thus, the insulated gate bipolar transistor 16 can be relatively costly. The voltage rating and the corresponding energy rating of the insulated gate bipolar transistor 16 is a significant factor in the cost of the insulated gate bipolar transistor 16.

BRIEF DESCRIPTION OF THE DRAWINGS

Embodiments are illustrated by way of example and are not limited in the accompanying figures.

Figure 1:
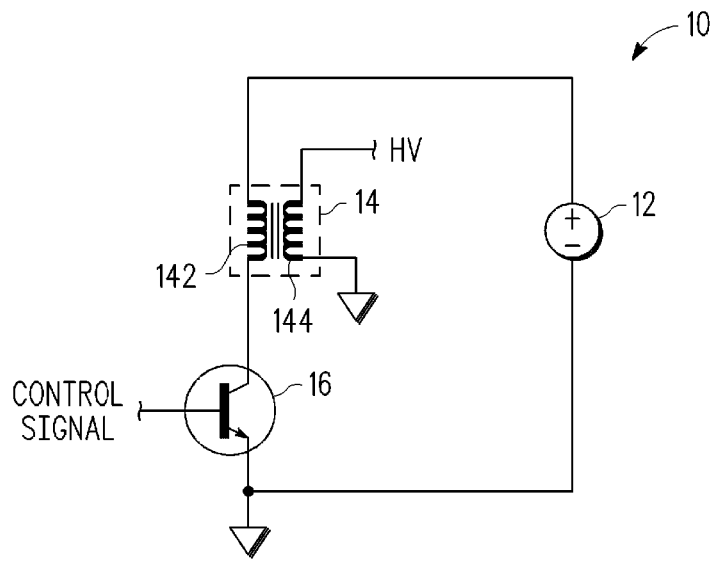
FIG. 1 includes a functional block diagram of a conventional ignition system (prior art).

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can be used with a system, such as an ignition system, that operates a relatively high voltage. The electronic device can include a signal clamping control module that can include a signal reference module, and a feedback control module. The signal reference module is operable to provide a reference signal to the feedback control module. The feedback control module can be configured to also receive a feedback signal from a signal scaling module, which can be an external module, wherein the feedback signal has a magnitude that is representative of a signal at a current carrying electrode of a power transistor. Based on the comparison of the reference signal to the feedback signal, the feedback control module provides one or more signals to a control electrode signal to a control electrode.

Embodiments as described herein can be implemented by changing the design of an existing integrated circuit and using a signal scaling module to generate the feedback signal representative of the signal at the anode of the power transistor, so that the feedback signal can be used by the integrated circuit. The embodiment can significantly reduce the cost of the system because a significantly simpler and less expensive power transistor can be used.

Embodiments described herein can incorporate different types of transistors within the portions of the circuits. In particular, a source of a p-channel transistor may be coupled to a relatively higher voltage, and a drain of the p-channel transistor may be coupled to a relatively lower voltage, whereas a drain of an n-channel transistor may be coupled to a relatively higher voltage, and a source of the n-channel transistor may be coupled to a relatively lower voltage. To reduce confusion with terms, such as "source," "drain," "emitter," "collector," and the like, when referring to a particular current carrying electrode of a transistor, the current carrying electrode that is coupled to a relatively higher voltage will be referred to as the "anode," and the current carrying electrode that is coupled to a relatively lower voltage will be referred to as the "cathode," regardless whether the actual implementation is a p-channel transistor, an n-channel transistor, a pnp bipolar transistor, an npn bipolar transistor, or the like.

All technical and scientific terms used herein have the same meaning as commonly understood by one of ordinary skill in the art to which this invention belongs. Other features and advantages of the invention will be apparent from the following detailed description, and from the claims. To the extent not described herein, many details regarding specific materials, processing acts, and circuits are conventional and may be found in textbooks and other sources within the semiconductor, microelectronic, and internal combustion engine arts.

Figure 2:
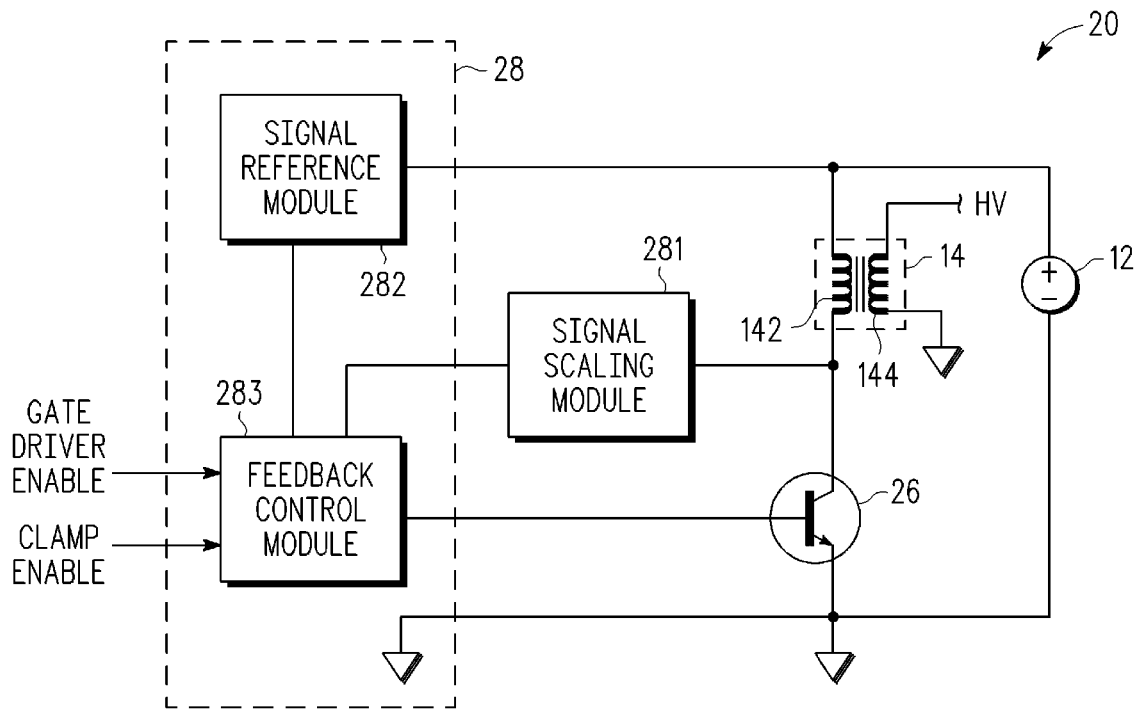
FIG. 2 includes a functional block diagram of a system including a transformer, a power transistor, a signal scaling module, and a signal clamping control module.

FIG. 2 includes an illustration of a functional block diagram of a system 20. The system 20 can include or be part of a vehicle, a generator, or another suitable apparatus used to generate a voltage, HV, from a fixed voltage supply. In a particular embodiment, the system 20 can be an ignition system for an internal combustion engine. The system 20 includes a power supply 12 that supplies a power supply voltage to the system 20. The power supply 12 can be a 12-volt automobile battery, a 6-volt motorcycle battery, a battery used for a motorboat motor, a generator, another suitable apparatus, or any combination thereof.

A positive terminal of the power supply 12 is coupled to a terminal of a primary winding 142 of a transformer 14. In one embodiment, the transformer 14 can be an ignition coil. In another embodiment, the transformer may be used for a different application in which a high voltage is to be provided by a secondary winding 144 of the transformer 14, and therefore, the transformer 14 is not limited to an ignition coil. The primary winding 142 includes another terminal that is coupled to a power transistor 26 and to a signal scaling module 281 that provides a feedback signal to a signal clamping control module 28. A terminal of the secondary winding 144 is coupled to a ground terminal or a terminal of a battery, and another terminal of the secondary winding 144 is coupled to a component designed to operate and a relatively high voltage that can reach over approximately 1000 volts. In one particular embodiment, this other terminal can be coupled to a distributor that can be coupled to spark plugs of an internal combustion engine.

During operation, signals labeled GATE DRIVER ENABLE and CLAMP ENABLE are provided to feedback control module 283. When signal CLAMP ENABLE is negated system 20 operates in a traditional manner whereby the signal GATE DRIVER ENABLE when asserted will cause transistor 26 to turn on, and when negated will cause transistor 26 to turn off. When signal CLAMP ENABLE is asserted, the signal GATE DRIVER ENABLE continues to control transistor 26, however a voltage across the power transistor 26 will be clamped as described below. In one embodiment, the gate driver enable signal and the clamp enable signal come from a different device (i.e., off chip), for example, a central processing unit within an electronic control module. In another embodiment, the gate driver enable signal may come from another portion of the signal clamping control module 28 or another electrical circuit outside signal clamping control module 28.

The power transistor 26 can withstand a significantly higher voltage, current, or power during normal operation than a transistor used in a conventional digital logic circuit. The power transistor 26 includes an insulated gate bipolar transistor, a lightly doped metal-oxide-semiconductor ("MOS") field-effect transistor ("LDMOS"), a v-shaped or u-shaped MOS transistor, a power bipolar transistor (i.e., other than an insulated gate bipolar transistor), or the like. As illustrated in FIG. 2, the power transistor 26 is a discrete insulated gate bipolar transistor. An anode of the power transistor 26 is coupled to the primary winding 142 of the transistor 14, and a cathode of the power transistor 26 is coupled to a ground terminal and a negative terminal of the power supply 12. A control electrode of the power transistor 26 is coupled to a signal clamping control module 28. When the power transistor 26 includes an insulated gate bipolar transistor, the anode is a collector, the cathode is an emitter, and the control electrode is a gate. When the power transistor 26 is a field-effect transistor, the current carrying electrodes are a source and a drain, and when the power transistor 26 is a bipolar transistor, the control electrode is a base of the bipolar transistor.

As will be described in more detail, the system 20 is configured such that the voltage difference between the current carrying electrodes of the power transistor 26 can be clamped at a voltage significantly lower than would otherwise occur using a conventional system, such as the system 10 in FIG. 1. Therefore, the design of the power transistor 26 can be simplified. Thus, the cost of the power transistor 26 can be significantly reduced.

The signal clamping control module 28 includes a signal reference module 282 and a feedback control module 283. The signal reference module 282 provides a reference signal to the feedback control module 283. The reference signal can be a fixed value or proportionately higher than a signal associated with a power supply signal. The signal reference module 282 has an input terminal that is coupled to the positive terminal of the power supply 12 and the primary winding 142 of the transformer 14, and an output terminal that is coupled to an input terminal of the feedback control module 283. The internal circuitry of the signal reference module 282 is described in more detail with respect to FIGS. 4 and 9.

The feedback control module 283 also includes another input terminal that is coupled to the output terminal from the signal scaling module 281. The feedback control module 283 is configured to compare the reference signal (from the signal reference module 282) to the feedback signal (from the signal scaling module 281). If the reference signal is greater than the feedback signal, the feedback control module 283 can determine the system 20 is in a first state, and if the reference signal is less than the feedback signal, the feedback control module 283 can determine the system is in a second state.

The feedback control module 283 is further operable to provide a control signal in response to the state determination. The feedback control module 283 provides a control electrode signal that is received by the control electrode of the power transistor 26. The internal components within feedback control module 283 are described in more detail with respect to FIGS. 5 and 10. A ground terminal of the signal clamping control module 28 is coupled to the cathode of the power transistor 26 and the negative terminal of the power supply 12.

Although not illustrated in FIG. 2, the signal clamping control module 28 can include other power supply terminals, data or other signal terminals, and other circuitry. The signal clamping module 28 can be within a single integrated circuit. In another embodiment, each of the signal reference module 282 and the feedback control module 283 may be located in different integrated circuits or may have the functions of each of the signal reference module 282 and the feedback control module 283 split between more than one integrated circuit. In still another embodiment, the signal clamping module 28 control can be part of a circuit board with separate integrated circuits, discrete components, or any combination thereof that provide the functions that are described with respect to the signal reference module 282 and the feedback control module 283. In still another embodiment, the signal scaling module 281 can be incorporated into the signal clamping control module 28.

Figure 8:
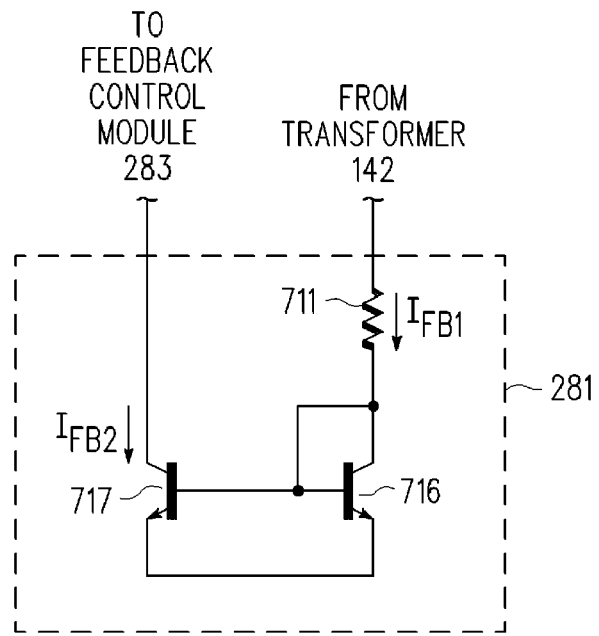
FIG. 8 includes a circuit diagram of a signal scaling module of FIG. 2 in accordance with a current-based embodiment.
Figure 9:
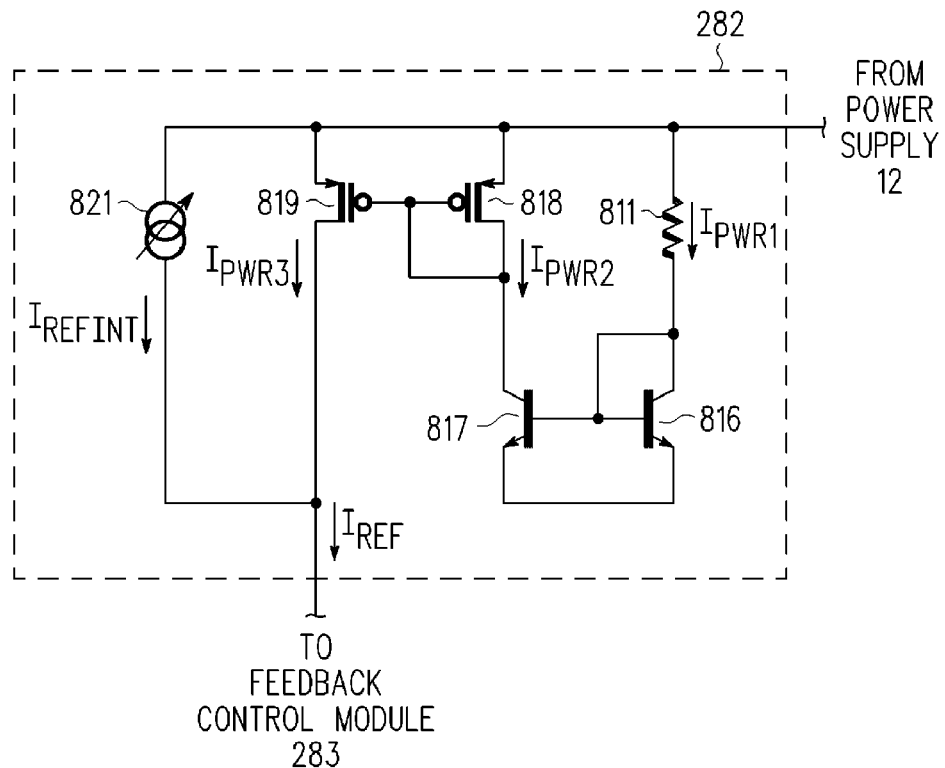
FIG. 9 includes a circuit diagram of a signal reference module of the signal clamping control module of FIG. 2 in accordance with a current-based embodiment.
Figure 10:
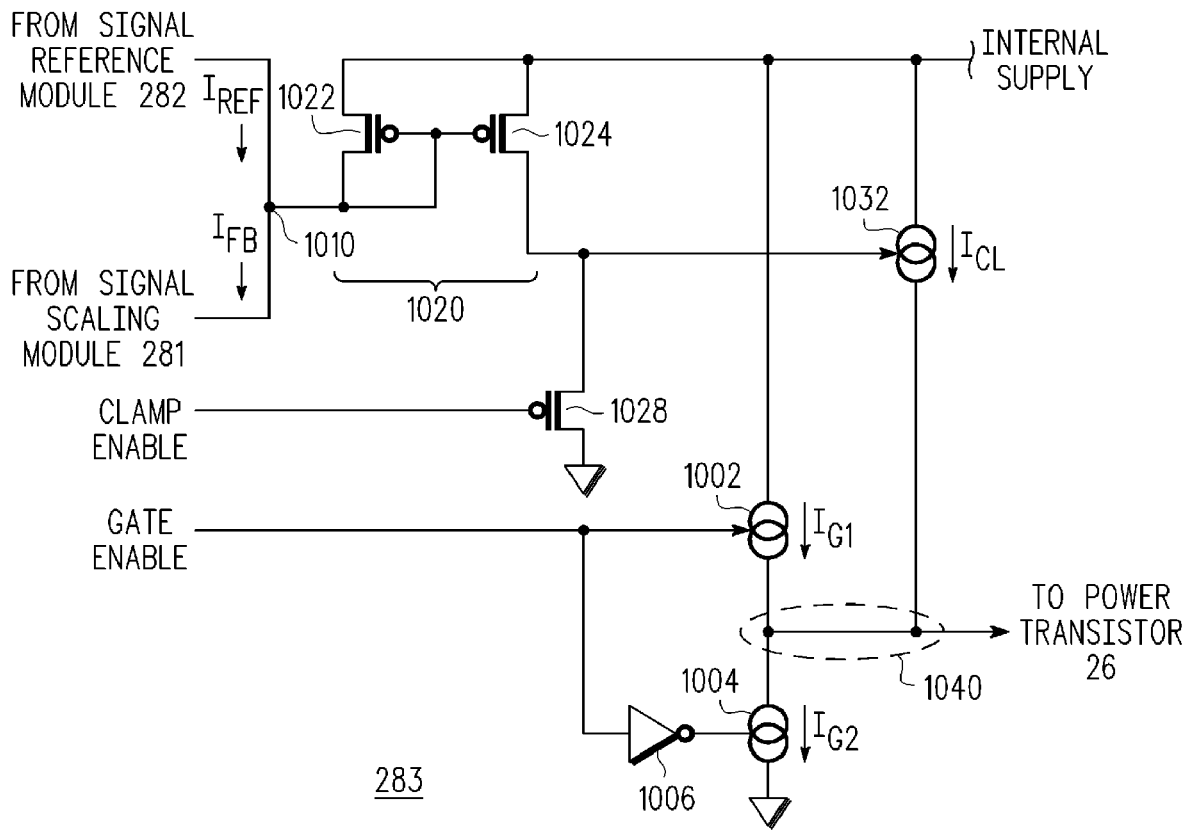
FIG. 10 includes a circuit diagram of a feedback control module of the signal clamping control module of FIG. 2 in accordance with a current-based embodiment.

The system 20 can operate based on voltages or currents. FIGS. 3 to 7 illustrate embodiments based on voltages, and FIGS. 8-10 illustrate embodiments based on currents.

Figure 3:
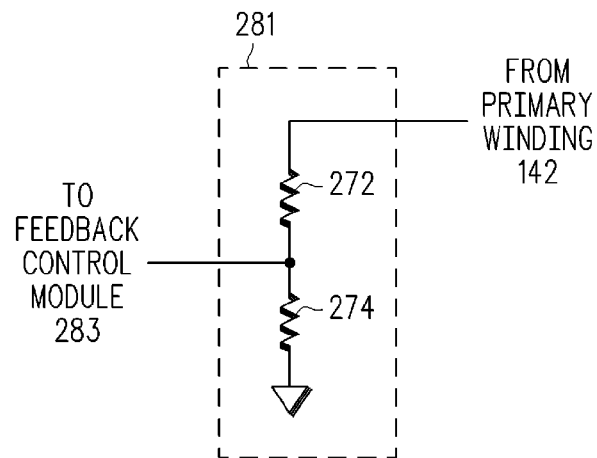
FIG. 3 includes a circuit diagram of a signal scaling module of FIG. 2 in accordance with a voltage-based embodiment.

FIG. 3 includes a circuit diagram of a circuit that can be used for the signal scaling module 281. In this embodiment, signal scaling module 281 includes a voltage divider that includes a resistive element 272 and a resistive element 274. The voltage divider is configured to step down the voltage at the anode of the power transistor 26 when operating the system 20 in its normal operating mode. In one particular embodiment, the external voltage divider can reduce the voltage received from the anode of the power transistor 26 to a smaller voltage that can be more readily used by the voltage clamping module 28. In one particular embodiment, the external voltage divider can reduce the input voltage (from the anode of the power transistor 26), such that the output voltage is by approximately 10% of the input voltage. After reading this specification, skilled artisans will appreciate that in other embodiments, other ratios between the input voltage and the output voltage of the external voltage divider can be adjusted to the particular needs or desires of the user.

More particularly, referring to the voltage divider in FIG. 3, one terminal of the resistive element 272 is coupled to the primary winding 142 of the transformer 14 and the anode of the power transistor 26. The other terminal of the resistor 272 is coupled to one of the terminals of the resistive element 274 and the voltage clamping module 28. The other terminal of the resistive element 274 is coupled to a ground terminal.

Figure 4:
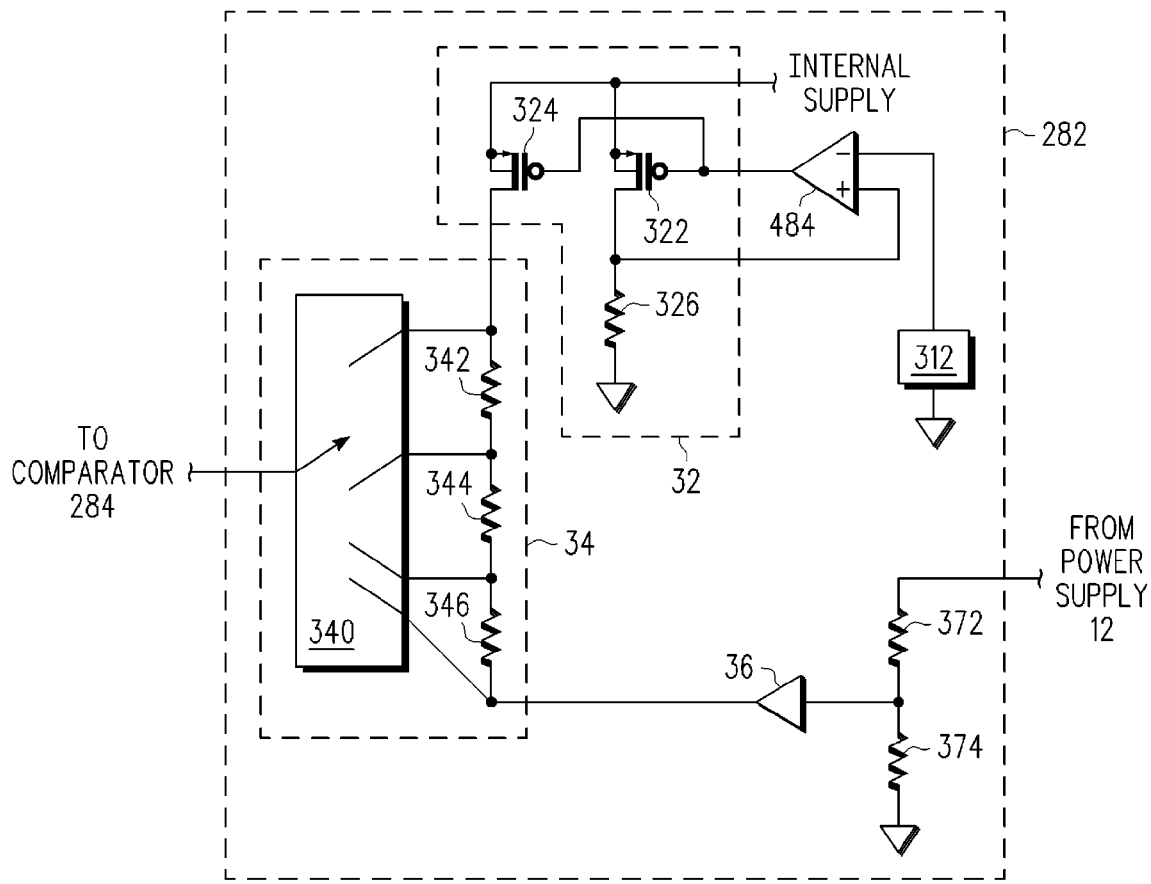
FIG. 4 includes a circuit diagram of a signal reference module of the signal clamping control module of FIG. 2 in accordance with a voltage-based embodiment.

FIG. 4 includes a circuit diagram of a circuit that can be used for the signal reference module 282. The signal reference module 282 includes an internal voltage divider that includes a resistive element 372 and a resistive element 374. The internal voltage divider is operable to receive a voltage from the power supply 12 and step that voltage down. In one particular embodiment, the voltage received at the voltage clamping module 28 may be approximately 12 volts, and the internal voltage divider can reduce that voltage to approximately 1.2 volts. After reading this specification, skilled artisans will appreciate that in other embodiments, other ratios between the input voltage and the output voltage of the internal voltage divider can be adjusted to the particular needs or desires of the user.

Regarding the couplings of the internal voltage divider, one of the terminals of the resistive element 372 is coupled to the positive terminal of the power supply 12. The other terminal of the resistor 372 is coupled to one of the terminals of the resistive element 374 and to an input terminal of a voltage selection module 34. The other terminal of the resistive element 374 is coupled to a ground terminal.

A buffer 36 lies between the output terminal of the internal voltage divider and an input terminal of the voltage selection module 34. The buffer 36 is operable to buffer the output signal of the internal voltage divider before reaching the voltage selection module 34. In another embodiment, the buffer 36 is not present in the signal reference module 282, and the output terminal of the internal voltage divider can be connected to an input terminal of the voltage selection module 34.

In the embodiment as illustrated in FIG. 4, the signal reference module 282 includes a voltage source module 312. The voltage source module 312 receives energy from an external source (not illustrated) to produce a voltage. In one embodiment, the internal voltage source module 312 can provide a voltage is approximately a voltage associated with the band gap of a semiconductor material. For example, if the semiconductor material is silicon, the voltage can be approximately 1.1 volts. For a different semiconductor material is used, such as germanium, silicon germanium, carbon-doped silicon, Group III-V, Group II-VI, or the like, the voltage from the internal voltage source module 312 can be different. A negative terminal of the voltage source module 312 is coupled to a ground terminal, and a positive terminal of the voltage source module 312 is coupled to a negative terminal of a measurement module 484.

The measurement module 484 can include an operational amplifier (illustrated in FIG. 4), a comparator (not illustrated), or another suitable circuit. The measurement module 484 may operate using voltages, pulse wave modulation, or the like. In the embodiment as illustrated in FIG. 4, the measurement module 484 is an operational amplifier that operates using voltages as input signals. The positive input terminal of the measurement module 484 and the output terminal of the measurement module 484 are coupled to different portions of a current mirror 32. The current mirror 32 is operable to provide a reference current that can be supplied to the voltage selection module 34. In a particular embodiment, the reference current can be based upon a bandgap-referenced voltage.

The current mirror can include a pair of transistors 322 and 324 and a resistive element 326. The transistors 322 and 324 can be field-effect transistors or bipolar transistors. In the embodiment as illustrated in FIG. 4, the transistors 322 and 324 are p-channel transistors that are substantially identical to each other. The control electrodes (e.g., gates) of the transistors 322 and 324 are coupled to the output terminal of the measurement module 484. The anodes (e.g., sources) of the transistors 322 and 324 are coupled to an internal power supply rail of the voltage clamping module 28. In one particular embodiment, the internal power supply rail can be coupled to a $V_{DD}$ terminal. The cathode (e.g., drain) of the transistor 322 is coupled to the positive terminal of the measurement module 484 and a terminal of the resistive element 326. The other terminal of the resistive element 326 is coupled to a ground terminal.

The voltage selection module 34 allows any one of a plurality of voltages to be selected. The voltage selection module 34 provides the reference voltage to a comparator 284 (illustrated in FIG. 5) of the feedback control module 283. The voltage selection module 34 is configured such that it can output a voltage as high or higher than the feedback voltage corresponding highest clamping voltage that is to be used for the power transistor 26. For example, if the highest clamping voltage is approximately 45 V, the voltage selection module 34 can be configured to provide approximately 4.5 V, when the external and internal voltage dividers reduce the voltage to approximately 10% of their incoming voltages. The voltage selection module 34 allows an intermediate voltage to be selected. In the embodiment illustrated in FIG. 4, the intermediate voltage can be between the voltage at the output terminal of the internal voltage divider and the voltage at the output terminal from the current mirror 32. In a particular embodiment, the intermediate voltage can be approximately 2.5 V, and using the embodiment as illustrated in FIG. 2, the clamping voltage for the power transistor 26 is 25 V.

Referring to the circuit as illustrated in FIG. 4, the voltage selection module 34 includes an input terminal coupled to the current mirror 32. The voltage selection module 34 further includes a set of serially connected resistive elements 342, 344, and 346. Each of the terminals of the resistive elements 342, 344, and 346 are coupled to input terminals of a multiplexer 340. In other embodiments, more or fewer resistive elements may lie within the set of serially connected resistive elements.

The multiplexer 340 is configured to selectively couple its output terminal to one of different voltages at the input terminals of the multiplexer 340. Although not illustrated, a control signal can be received by the multiplexer 342 in order to select the proper input terminal corresponding to the desired voltage to be produced at the output terminal of the multiplexer 340. Thus, a variety of different voltages can be produced by the signal reference module 282 that can range from a voltage reflective of the power supply 12 to a voltage as high as the voltage produced by the current mirror 32. In another embodiment (not illustrated), the signal reference module 282 may not include a voltage selector and may provide only a single, non-selectable reference voltage.

Figure 5:
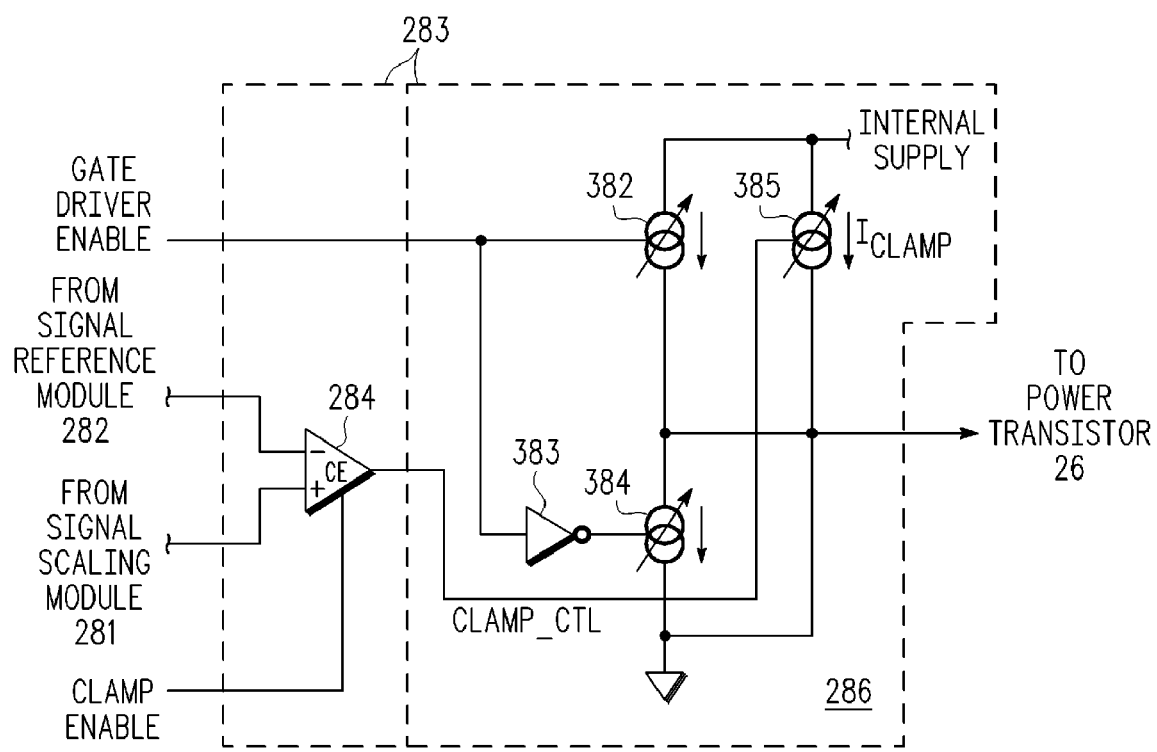
FIG. 5 includes a circuit diagram of a feedback control module of the signal clamping control module of FIG. 2 in accordance with a voltage-based embodiment.

FIG. 5 illustrates a voltage-based embodiment of the feedback control module 283. The feedback control module 283 includes a measurement module 284 and a control signal drive module 286. As illustrated in the embodiment of FIG. 5, the control signal drive module 286 includes a portion of the feedback control module 283 other than the measurement module 284. A gate driver enable signal is provided from a microcontroller to the feedback control module 283 for generating a signal to turn the power transistor on and off. Therefore, the gate driver enable signal is used to provide a signal that increases current flowing through the power transistor 26 independent of the signal clamping mechanism controlled by signal clamp enable. The gate driver enable signal can be received by a control terminal of a component 382 and an input terminal of an inverter 383. An output terminal of the inverter is coupled to a control electrode of a component 384. The component 382 has an input terminal coupled to an internal power supply rail, e.g., $V_{DD}$, and an output terminal coupled to the control electrode of the power transistor 26. The component 384 has an input terminal coupled to a ground terminal and an output terminal coupled to the control electrode of the power transistor 26.

The measurement module 284 includes a negative input terminal that is coupled to the output terminal of the signal reference module 282, and includes a positive input terminal that is coupled to the output terminal from the signal scaling module 281. The measurement module includes an output that provides a signal based upon a comparison of the feedback signal from the signal reference module 282 and the reference signal from the signal scaling module 281. The measurement module 284 can include an operational amplifier (as illustrated in FIG. 5), a comparator (not illustrated), or another suitable circuit. The measurement module 284 may operate using voltages, pulse wave modulation, or the like.

In the embodiment as illustrated in FIG. 5, the measurement module 284 is an operational amplifier that operates using voltages as input signals. The signal from the signal scaling module 281 is referred to as a feedback signal, and in this particular embodiment is a feedback voltage, and the signal from the signal reference module 282 is referred to as a reference signal, and in this particular embodiment is a reference voltage. The measurement module 284 is configured to compare the reference signal (from the negative input terminal) to the feedback voltage (from the positive terminal). If the reference voltage is greater than the feedback voltage when the measurement module 284 is enabled by the clamp enable signal, the measurement module 284 can determine that the system 20 is in a first state, and if the reference voltage is less than the feedback voltage when the measurement module 284 is enabled by the clamp enable signal, the measurement module 284 can determine that the system is in a second state. One or more output signals can be generated by the measurement module 284 that reflect whether the system 20 is in the first state or the second state. In other words, if the reference voltage is higher than the feedback voltage, e.g., the first state, the voltage difference across the current carrying terminals of the power transistor 26 is below a clamping voltage and no clamping is needed. However, if the reference voltage is less than the feedback voltage, the voltage difference across the current carrying terminals of the power transistor 26 will be limited to substantially the clamping voltage.

The measurement module 284 includes an output terminal that is coupled to a control terminal of a component 385. The component 385 has an input terminal coupled to an internal power supply rail, e.g., $V_{DD}$ and an output terminal coupled to the control electrode of the power transistor 26. The component 386 has an input terminal coupled to a ground terminal and an output terminal coupled to the control electrode of the power transistor 26.

When the clamp enable is activated and the signal from the signal scaling module 281 is higher than the signal from the signal reference module 282, then the measurement module 284 provides an output signal that increases current flowing through the power transistor 26, allowing the voltage across the power transistor to be reduced to produce a voltage at its anode. In one embodiment when the output signal corresponds to the voltage of an internal power supply rail, e.g., $V_{DD}$, the power transistor 26 is turned on to allow voltages of the current carrying electrodes of the power transistor 26 to become closer to each other. In another embodiment when the output signal corresponds to the voltage of the ground terminal, the power transistor 26 is turned off, and therefore, substantially no current flows through the power transistor 26.

The operation of the system 20 will be described with respect to an ignition system of an internal combustion engine with reference to the functional block diagram in FIGS. 2 to 5, the timing diagram in FIG. 6 and the flow diagram in FIG. 7 when a voltage-sensing embodiment is used. In one particular embodiment, the clamping voltage for the power transistor 26 will be approximately 25 V, and the signal scaling module 281 provides the voltage at the output terminal (i.e., the feedback voltage) that is 10% of the voltage at the anode of the power transistor 26. Because the feedback voltage is approximately 10% of the voltage difference between the current carrying electrodes of the power transistor 26 and the clamping voltage is approximately 25 V, in this particular embodiment, the signal reference module 282 provides approximately 2.5 V to the negative terminal of the measurement module 284.

Figure 6:
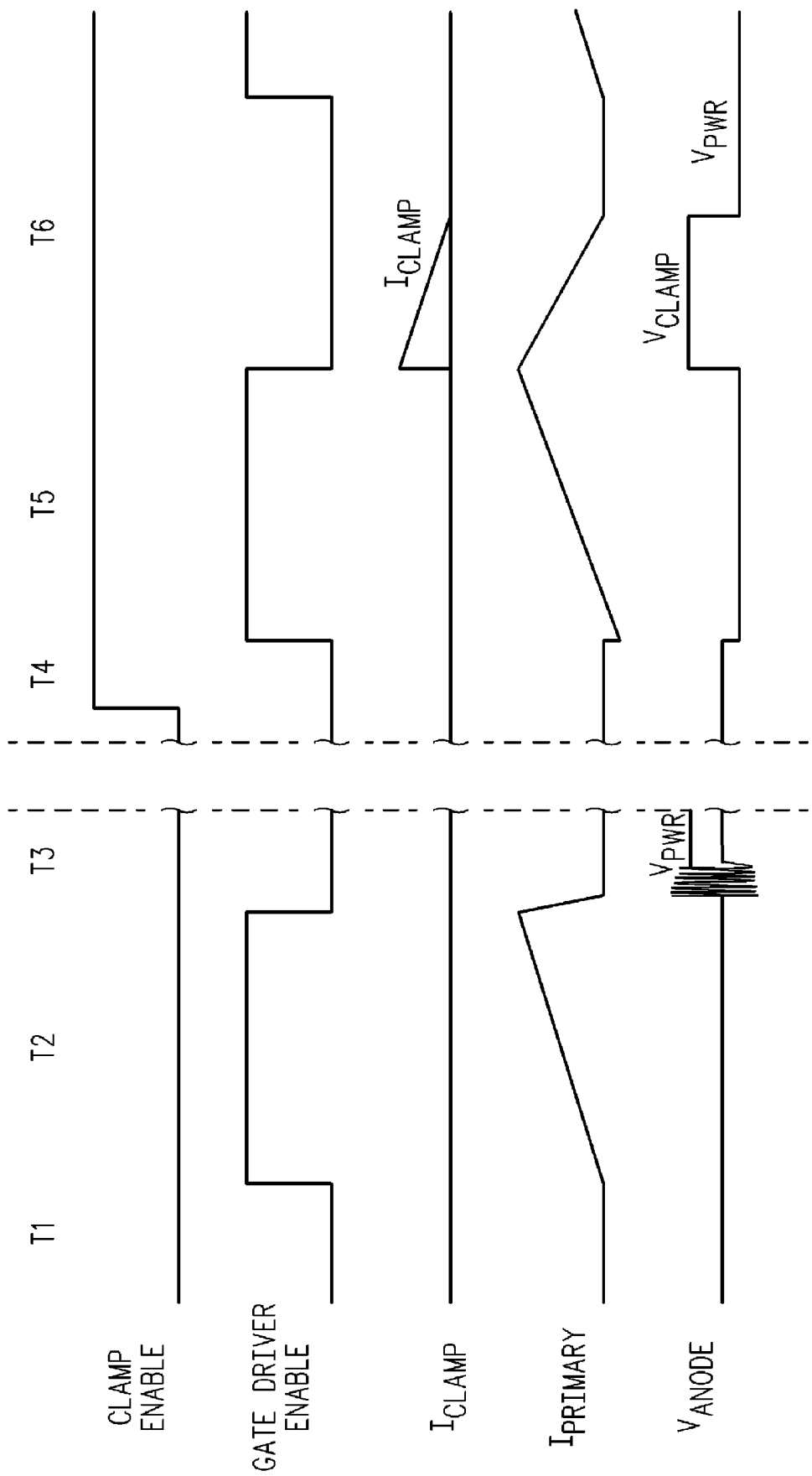
FIG. 6 includes a timing diagram when using the system of FIGS. 2 to 5 when the signal clamping control module is enabled and when it is disabled.

With respect to the timing diagram in FIG. 6, six time periods, $T_1$ to $T_6$, are illustrated. A first portion of the timing diagram, which includes $T_1$ to $T_3$, reflects the method when the clamping circuitry is not used. During this first portion, the clamp enable signal is in its disabled or deactivated state. A second portion of the timing diagram, which includes $T_4$ to $T_6$, reflects the method when the clamping circuitry is used, and thus, the clamp enable signal is in its enabled or activated state. The first portion of the timing diagram corresponds to a timing diagram that would be seen with the conventional ignition system 10 illustrated in FIG. 1. The time period $T_1$ in FIG. 6 illustrate signals before a gate driver enable signal is received.

Referring to $T_2$ in FIG. 6, the gate driver enable signal is asserted by the control feedback control module 283 to provide a control electrode signal to the control electrode of the power transistor 26 to increase current flowing through the power transistor 26. Current flows through the primary winding 142 of the transformer and through power transistor 26. During this time, the current through the primary winding 142 of the transformer 14 increases, as illustrated by the signal during $T_2$ in FIG. 6.

The current flowing through the power transistor 26 is decreased or the power transistor 26 is then turned off by changing the state, e.g., negating, of the gate driver enable signal during $T_3$ in FIG. 6 to the control signal drive module 286. When the current flowing through the power transistor 26 is decreased or the power transistor 26 is turned off, the voltage provided by the secondary winding 144 of the transformer 14 increases and is provided to a distributor of the internal combustion engine. Also, the voltage difference between the current carrying electrodes of the power transistor 26 increases. Because the voltage clamp is not used, the current through the primary winding 142 of the transformer 14 decreases much faster than when the voltage clamp is enabled, as will be described with respect to $T_6$ when the clamping circuit is enable. The voltage difference across the current carrying terminals of the power transistor 26, illustrated as $V_{ANODE}$ signal during $T_3$ can reach approximately 400V (exceeds the scale in the timing diagram in FIG. 6). The voltage difference between the current carrying terminals of the power transistor, illustrated as $V_{ANODE}$ signal during $T_3$ quickly reaches substantially the same voltage as the voltage difference between the negative and positive terminals of the power supply 12 (12 V in this embodiment).

Figure 7:
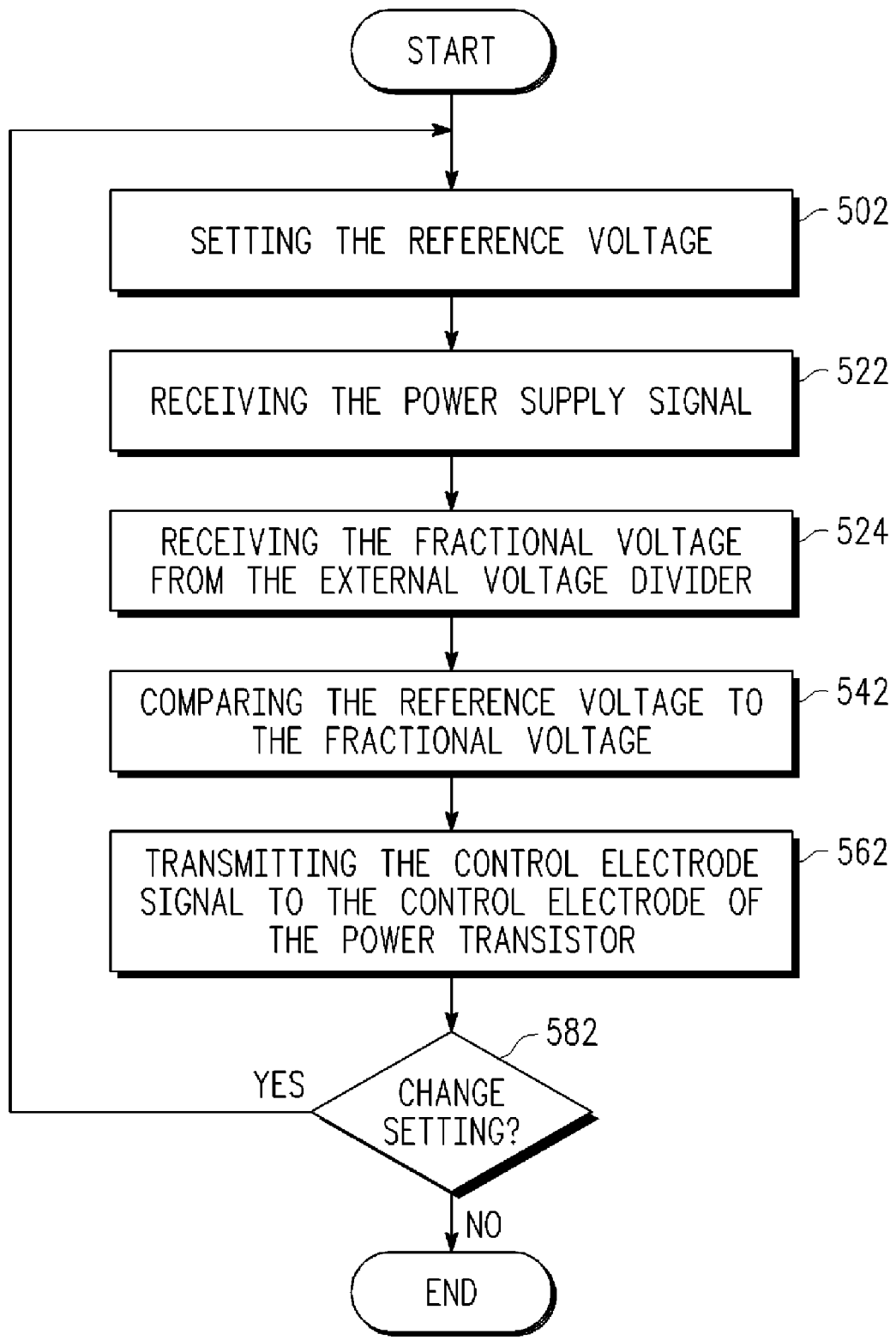
FIG. 7 includes flow diagram of a method of using the system of FIGS. 2 to 5 in accordance with a voltage-based embodiment.

Time periods $T_4$ to $T_6$ in FIG. 6, and the flow diagram in FIG. 7 illustrates how the system operates when the clamp circuit is used. The flow diagram of FIG. 7 is the method as described from the perspective of the signal clamping control module 28. The method can include setting the reference voltage, at block 502 of FIG. 7. The reference voltage of the signal reference module 282 can be set by a manufacturer of the system 20, a user of the system 20, or automatically by the system 20 or another system coupled to the system 20. The method can also include receiving the power supply signal and the fractional voltage from the signal scaling module 281 at blocks 522 and 524 of FIG. 7. The power supply signal can include the power supply voltage from the power supply 12. In one embodiment, the fractional voltage refers to the feedback voltage provided by the external voltage divider to the signal clamping control module 28. In one embodiment, the fractional voltage is approximately 10% of the voltage difference between the current carrying electrodes of the power transistor 26. The time period $T_4$ in FIG. 6 illustrate signals before a gate driver enable signal is received.

The method can also include increasing current flowing through or turning on the power transistor 26 to charge the primary winding of the transformer 14. More specifically, a gate driver enable signal during $T_5$ is received by the control signal drive module 286 to provide a control electrode signal to the control electrode of the power transistor 26 to increase current flowing through or turn on the power transistor 26 even though the clamping voltage is not exceeded. Current flows through the primary winding 142 of the transformer and through power transistor 26. The current flowing through the power transistor 26 is substantially the same as the current flowing through the primary winding 142. During this time, the current through the primary winding 142 of the transformer 14 increases, as illustrated by signal during $T_5$ in FIG. 6.

The method also includes comparing the reference voltage to the fractional voltage, at block 542. Referring to FIG. 2, the reference voltage is provided by the signal reference module 282 to the negative terminal of the measurement module 284, and the fractional voltage, which is the feedback voltage in this embodiment, is provided to the positive terminal of the measurement module 284.

The current flowing through the power transistor 26 is decreased or the power transistor 26 has current flowing through the power transistor 26 decreased or is turned off by changing the state of the gate driver enable signal, illustrated in $T_6$ of FIG. 6, to the control signal drive module 286. When current flowing through the power transistor 26 is decreased or the power transistor 26 is turned off, the voltage produced by the secondary winding 144 of the transformer 14 increases. The voltage produced by the secondary winding 144 is provided to a distributor of an internal combustion engine. During the same time period, the voltage difference between the current carrying electrodes of the power transistor 26 increases. Before the voltage difference reaches or exceeds the clamping voltage, the measurement module 284 sends appropriate signal(s) to the circuit including the components 385 and 386 to keep the control electrode signal to the power transistor 26 at its corresponding deactivated state, which in a particular embodiment is about ground potential.

After the voltage difference reaches or exceeds the clamping voltage, the feedback voltage exceeds the reference voltage (2.5 V in this embodiment), and the measurement module 284 sends an appropriate signal(s) to activate the circuit including the components 385 and 386, illustrated as the $I_{CLAMP}$ signal during $T_6$ in FIG. 6. The method further includes transmitting the $I_{CLAMP}$ signal to the control electrode of the power transistor, at block 562. Referring to the control drive module as illustrated in FIG. 5, input signals are received by the control electrodes of the components 385 and 386 and change their relative magnitudes of current through or change the states of the components 385 and 386. The $I_{CLAMP}$ signal is taken to its corresponding active state, which in a particular embodiment is substantially the voltage of the internal power supply rail. The current flowing through the power transistor 26 is increased, or the power transistor 26 is turned on.

The signal clamping control module 28 regulates the voltage difference across the current carrying terminals of the power transistor 26 to a desired the clamping voltage. The current flowing through the primary winding coil 142 of the transformer decreases gradually as illustrated by $I_{PRIMARY}$ during $T_6$ in FIG. 6. Eventually, the voltage difference between the current carrying terminals of the power transistor, illustrated as $V_{ANODE}$ signal during $T_6$ in FIG. 6 decreases from approximately the clamping voltage to substantially the voltage between the negative and positive terminals of the power supply 12 (12 V in this embodiment).

The setting for the reference voltage does not need to be changed after it is initially set. Still, the circuits as described herein can allow for the setting to be changed. In this particular embodiment, the method can further include determining whether or not the setting of the reference voltage is to be changed, at decision tree 582 of FIG. 7. If yes, the method proceeds to block 502. Otherwise, the method can end or return to block 522 (not illustrated in FIG. 7).

Note that when the clamp is used, the maximum voltage difference across the current carrying terminals of the power transistor 26 can be significantly lowered. In the prior example, the voltage difference can be approximately 25 volts when the voltage clamp is used instead of 400 volts, as would occur with the conventional ignition system 10 in FIG. 1. By using the signal clamping module 28, a simpler design of the power transistor 26 can be used because the maximum voltage across the current carrying terminals of the power transistor 26 can be limited, and thus, significantly reduce the cost of the power transistor 26. Many ignition systems typically already include an integrated circuit within an engine controller. Incorporating the circuitry to support the system 20 may involve a design change to an existing mask set, and may not change the manufacturing cost of the integrated circuit because additional masks may not be required. The resistive elements 272 and 274 within the signal scaling module 281 can be commercially available resistors, and do not need to be high precision resistors, although high precision resistors can be used, if desired. Therefore, the resistive elements 272 and 274 can be relatively inexpensive. The combined cost of the power transistor 26 and resistive elements 272 and 274 can be substantially lower than the cost of the power transistor 16 in FIG. 1.

The embodiments as illustrated in FIGS. 3 to 5 focus more on voltage-sensing embodiments. In another embodiment, a current-sensing embodiment of the system 20 can be used. FIGS. 8 to 10 include alternate embodiments of the modules 281, 282, and 283 that can be used to implement the block diagram of FIG. 2 using current signal. FIG. 8 includes a circuit diagram of a circuit that can be used for the signal scaling module 281 to generate a feedback current IFB2. The signal scaling module 281 of FIG. 8 includes a resistor 711, an NPN transistor 716, and a NPN transistor 717. The resistor 711 includes a first terminal that is coupled to the transformer 142, and a second terminal. The NPN transistor 716 includes a first current carrying terminal coupled to the second terminal of the resistor 711, a second current carrying terminal, and a control electrode coupled to the control electrode of the NPN transistor 717. The NPN transistor 717 includes a first current carrying terminal coupled to the feedback control module 283, and a second current carrying terminal coupled to the second current carrying terminal of the NPN transistor 716, and a control electrode coupled to the control electrode of the NPN transistor 716.

During operation, a current mirror is formed by the NPN transistors 716 and 717, such that a current $I_{FB1}$ through the NPN transistor 716 is proportionally mirrored at the NPN transistor 717 as current $I_{FB2}$, which is provided to the feedback control module 283. The signals $I_{FB1}$ and $I_{FB2}$ are approximately the same when the NPN transistors 716 and 717 are matched and have equal size, or alternatively, the signal $I_{FB2}$ can be proportional to the signal $I_{FB1}$ based upon the relative scaling, e.g., number of emitters of the NPN transistors 717 to 716.

Referring to FIG. 9, a circuit diagram is illustrated of a circuit that can be used to generate a reference current for the signal reference module 282. The signal reference module 282 includes a resistor 811, an NPN transistor 816, an NPN transistor 817, a p-channel transistor 818, a p-channel transistor 819, and a current source 821. The resistor 811 includes a first terminal coupled to power supply 12, and a second terminal. The NPN transistor 816 includes a first current carrying terminal coupled to the second terminal of resistor 811, a second current carrying terminal, and a control electrode. The NPN transistor 817 includes a first current carrying terminal, a second current carrying terminal coupled to the second current carrying terminal of the NPN transistor 816, and a control electrode coupled to the control electrode of the NPN transistor 816.

The p-channel transistor 818 includes a first current terminal coupled to the power supply 12, a second current terminal coupled to the first current carrying terminal of the NPN transistor 817, and a control electrode. The p-channel transistor 819 includes a first current terminal coupled to the power supply 12, a second current terminal, and a control electrode coupled to the control electrode of the p-channel transistor 818. The current supply 821 can be a variable current supply having a first terminal and a second terminal, wherein the first terminal is coupled to the power supply 12, and a second terminal is coupled to the second terminal of the p-channel transistor 819.

During operation, a current labeled $I_{PWR1}$ is generated through the resistor 811 based upon a voltage provided by the power supply 12. The NPN transistors 816 and 817 combine to form a current mirror, such that a current labeled $I_{PWR2}$ is provided to the collector terminal of the NPN transistor 817. The signal $I_{PWR2}$ is proportional to the current $I_{PWR1}$ assuming the NPN transistors 816 and 817 are matched, wherein $I_{PWR2}$ is proportional to $I_{PWR1}$ based upon the relative scaling of the NPN transistor 817 to the NPN transistor 816. The p-channel transistors 818 and 819 operate to form a current mirror, whereby signal $I_{PWR3}$ is proportional to signal $I_{PWR2}$, based upon the relative scaling, i.e., channel widths of the p-channel transistor 818 to the p-channel transistor 819. The current mirror, including the p-channel transistors 818 and 819, is used to provide a current reference that is a function of the voltage of the power supply 12. The current source 821 can be a fixed or variable current source that generates a reference signal labeled $I_{REFINT}$. The signals $I_{REFINT}$ and $I_{PWR3}$ are combined to form a reference signal labeled $I_{REF}$ that is provided to the feedback control module 283.

FIG. 10 includes a circuit diagram of a circuit that can be used for the feedback control module 283. Similar to the embodiment as illustrated in FIG. 5, the feedback control module 283 can receive a clamp enable signal and a gate enable signal that perform the same functions with respect to driving the power transistor 26 as previously discussed. The feedback control module 283 of FIG. 10 includes a pair of current supplies 1002 and 1004 that are controlled via the gate enable signal to provide a current to the power transistor 26 that controls the amount of current passing through the power transistor. The current supply 1002 has a terminal coupled to an internal supply and another terminal coupled to a node 1040, and the current supply 1004 has a terminal is coupled to the node 1040 and another terminal coupled to a ground or terminal. Therefore, when the gate enable signal is asserted, the current supply 1002 provides a current $I_{G1}$ to the node 1040 that is coupled to the control electrode (not illustrated in FIG. 10) of the power transistor 26. No significant current ($I_{G2}$) flows from the node 1040 to the ground terminal because the gate enable signal is inverted by an inverter 1006. When the gate enable signal is deactivated, no significant current ($I_{Gs}$) flows from the internal supply to the node 1040 from current source 1002 the current supply 1004 allows a current $I_{G2}$ to flow from the node 1040 to the ground terminal.

Within the feedback control module 283, the signals from the signal reference module 282 and the signal scaling module 281 are coupled together at node 1010. The feedback control module 283 further includes a current mirror 1020 that includes a PMOS transistor 1022 and a PMOS transistor 1024. Control gate electrodes of the transistors 1022 and 1024 and a current carrying electrode of the transistor 1022 are coupled to the node 1010. The other current carrying electrode of the transistor 1022 and a current-carrying electrode of the transistor 1024 are coupled to an Internal Supply reference. The other current carrying electrode of the transistor 1024 is coupled to a control terminal of a current supply 1032, which has a terminal coupled to the internal supply and another terminal coupled to the node 1040.

The feedback control module 283 further includes a transistor 1028. A current carrying electrode of the transistor 1028 is coupled to a control terminal of the current supply 1032, and another current carrying electrode of the transistor 1028 is coupled to ground.

During operation, when the clamp enable signal is deactivated, the clamp enable signal to turn on or otherwise activate the transistor 1028. When transistor 1028 is on, due to clamp enable being deactivated, the control terminal of the current supply 1032 will be at substantially ground potential and no significant current will flow through the current supply 1032 to the node 1040. Therefore, only the gate enable signal will control operation of the power transistor 26. When the clamp enable signal is activated, the transistor 1028 is turned off, and control of the current source 1032 is based upon the reference signal from signal reference module 28 and the feedback signal from scaling module 281. If an amount of current flowing from the signal reference module 282 to node 1010 is greater than the amount of current flowing from node 1010 to the signal scaling module 281, the additional current will result in transistor 1022 and transistor 1024 turning off, and the current from current supply 1032 being proportional to the current in transistor 1024 is zero and no significant current will flow through the current supply 1032 to the node 1040. Therefore, no active voltage clamping is occurring. However, if an amount of current flowing from the signal reference module 282 to node 1010 is less than the amount of current flowing from node 1010 to the signal scaling module 281, the additional current will flow through transistor 1022 and will be mirrored through transistor 1024 to drive current supply 1032. Based upon the signal provided to the control node of current supply 1032, a current will be provided to node 1040 that is proportional to the current through transistor 1024 that turns on power transistor 26.

Exemplary voltage-sensing or current-sensing embodiments have been described. Many other embodiments that are voltage-sensing or current-sensing can be used. Thus, the embodiments described herein only illustrate some particular embodiments and are not meant to limit the scope of the claims. After reading this specification, skilled artisans will appreciate that many different embodiments are possible. Throughout this specification, references have been made to couple and it variants (e.g., coupled, couplings, etc.). In a more particular embodiment, any combination of components or modules can be connected by connections (i.e., a direct connection, rather than an indirect connection).

In a one of the voltage-sensing embodiments, the signal scaling module 281 includes a voltage divider that has a corresponding resistance ratio, which is the ratio of the resistance of the resistive element 272 to the resistance of the resistive element 274. Similarly, the voltage divider within the feedback control module 282 as illustrate in FIG. 4 has a corresponding resistance ratio, which is the ratio of the resistance of the resistive element 372 to the resistance of the resistive element 374. The resistance ratio of the external voltage divider and the resistance ratio of the internal voltage divider can be substantially the same. By using substantially the same resistance ratio, use of the voltage clamping module can be easier for a user to understand and use with respect to how changes in the clamping reference voltage affect the clamping voltage for the power transistor 26.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a signal reference module having an output terminal, wherein the output terminal is configured to provide a reference signal, and a feedback control module having a first input terminal, a second input terminal, an output terminal, wherein the first input terminal of the feedback control module is coupled to the output terminal of the signal reference module to receive the reference signal, and the second input terminal of the feedback control module is configured to receive a signal corresponding to a scaled signal based upon a signal at a current carrying terminal of a power transistor. The feedback control module can be configured to provide an output signal in a first state when the scaled signal is less than a threshold signal, or the output signal in a second state when the scaled signal at least the threshold signal. The output terminal of the feedback control module can be configured to be coupled to a control electrode of the power transistor.

In an embodiment of the first aspect, the feedback control module includes a first measurement module and a control signal drive module. The feedback control module can have a first input terminal, a second input terminal, and an output terminal. The first input terminal of the first measurement module can be coupled to the output terminal of the signal reference module to receive the reference signal that is a reference voltage, the second input terminal of the first measurement module can be configured to receive the scaled signal that corresponds to a fraction of a voltage difference between current carrying terminals of the power transistor, and the output terminal can be configured to provide an output signal in a third state or a fourth state. The third state can correspond to the reference voltage being greater than a second input signal on the second input terminal, and the fourth state can correspond to the reference voltage being less than the second input signal on the second input terminal.

The control signal drive module can have an input terminal and an output terminal, wherein the input terminal of the control signal drive module is coupled to the output terminal of the first measurement module. The control signal drive module can be configured to provide an output signal in the first state or the second state, wherein the first state being in response to the output signal from the first measurement module being in the third state, and the second state being in response to the output signal from the first measurement module being in the fourth state. The output input terminal of the control signal drive module can be configured to be coupled to the control electrode of the power transistor.

In a particular embodiment of the first aspect, the second input of the first measurement module is configured to be coupled to a first voltage divider having a first resistance ratio, the signal reference module further includes a second voltage divider having a second resistance ratio, and the first resistance ratio and the second resistance ratio are substantially the same. In a more particular embodiment, the signal reference module further includes a current mirror and a voltage selection module, wherein the current mirror has a first terminal configured to receive a bandgap-referenced voltage, and a second terminal coupled to the voltage selection module, wherein the second terminal is configured to output a first current based on the bandgap-referenced voltage.

In an even more particular embodiment of the first aspect, the voltage selection module further includes a multiplexer and a set of serially connected resistive elements, wherein the multiplexer includes a plurality of input terminals including a first input terminal and a second input terminal, the first input terminal of the multiplexer is coupled to the second terminal of the current mirror, the second input terminal of the multiplexer is coupled to a node between two resistive elements within the set of serially connected resistive elements, an output terminal of the multiplexer is coupled to the output terminal of the signal reference module, and the multiplexer is configured to couple the output terminal of the multiplexer to any one of the plurality of input terminals of the multiplexer. In another even more particular embodiment, the current mirror includes a first transistor and a second transistor, anodes of the first transistor and the second transistor are connected to each other, control electrodes of the first transistor and the second transistor are connected to each other, and a cathode of the first transistor is coupled to the second terminal of the voltage selection module.

In another even more embodiment of the first aspect, the signal reference module includes a second measurement module having a first input terminal, a second input terminal, and an output terminal, wherein the first input terminal of the second measurement module is configured to receive a voltage from a voltage source module, the second input terminal of the second measurement module is coupled to the anode of the second transistor of the current mirror, and the output terminal of the second measurement module is coupled to the control gates of the first transistor and the second transistor. In yet an even more embodiment, the signal reference module further includes a resistive element having a first terminal and a second terminal, wherein the first terminal is coupled to the anode of the second transistor, and the second terminal is coupled to a ground terminal.

In another embodiment of the first aspect, the power transistor includes an insulated gate bipolar transistor. In yet another embodiment, the second input terminal of the first measurement module is configured to be coupled to an ignition coil of an internal combustion engine.

In a second aspect, a system can include a transformer including a first winding and a second winding, and a power transistor including a first current carrying terminal, a second current carrying terminal, and a control electrode, wherein the first current carrying terminal is coupled to a first terminal of the first winding of the transformer. The system can also include a signal scaling module having a first terminal, and a second terminal, wherein the first terminal is coupled to the first current carrying terminal of the power transistor, and the second terminal is operable to produce a scaled signal based upon a signal at the first current carrying terminal. The system can further include a signal clamping control module includes an input terminal and an output terminal, wherein the input terminal is coupled to the second terminal of the signal scaling module, and the output terminal is coupled to the control electrode of the power transistor to clamp a signal at the first current carrying terminal of the power transistor at a predetermined magnitude.

In an embodiment of the second aspect, the signal clamping control module includes a signal reference module includes a terminal operable to produce a reference signal, and a feedback control module includes a first input terminal, a second input terminal, and an output terminal, wherein the first input terminal of the feedback control module is coupled to the terminal of the signal reference module, the second input terminal of the feedback control module is coupled to the second terminal of the signal scaling module, and the output terminal is coupled to the control electrode of the power transistor to clamp the signal at the first current carrying terminal of the power transistor at the predetermined magnitude.

In a particular embodiment of the second aspect, the power transistor includes an insulated gate bipolar transistor. In another particular embodiment, the signal reference module further includes a voltage selection module that is operable to allow a plurality of different voltages to be used as the reference signal with respect to a clamping voltage for the power transistor. In still another particular embodiment, the transformer includes an ignition coil for an internal combustion engine.

In a third aspect, a method of using an electronic device can include receiving a power supply voltage, wherein the power supply voltage is coupled to a transformer that is coupled to a power transistor, generating a first reference voltage in response to receiving the power supply voltage, receiving a first fractional voltage that is a first fraction of a first voltage difference between current carrying terminals of the power transistor, comparing the first reference voltage to the first fractional voltage to determine a first voltage for a first control electrode signal, and transmitting the first control electrode signal to a control electrode of the power transistor.

In an embodiment of the third aspect, generating the first reference voltage includes generating a bandgap-referenced voltage and providing a first current to a voltage selection module, wherein the first current is based on the bandgap-referenced voltage. In a particular embodiment, the method further includes selecting a second reference voltage using the voltage selection module. In a more particular embodiment, the method further includes generating a second reference voltage in response to receiving the power supply voltage after selecting the second reference voltage, wherein generating the second reference voltage is performed after generating the first reference voltage, and the second reference voltage is different from the first reference voltage. The method can also include receiving a second fractional voltage that is a second fraction of a second voltage difference between the current carrying terminals of the power transistor, comparing the second reference voltage to the second fractional voltage to determine a second voltage for a second control electrode signal, and transmitting the second control electrode signal to the control electrode of the power transistor.

In a further embodiment of the third aspect, the method further includes activating a clamp enable signal before receiving the first fractional voltage, activating a gate driver enable signal to turn on the power transistor before receiving the first fractional voltage, deactivating the gate driver enable signal to turn off the power transistor before receiving the first fractional voltage. The clamp enable signal can remain activated at least until transmitting the first control electrode signal.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

Many other embodiments may be apparent to those of skill in the art upon reviewing the disclosure. Other embodiments may be used or derived from the disclosure, such that a structural substitution, logical substitution, or another change may be made without departing from the scope of the disclosure. Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description. It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electronic device comprising:
   a signal reference module having an output terminal, wherein the output terminal is configured to provide a reference signal; and
   a feedback control module having a first input terminal, a second input terminal, and an output terminal, wherein:
      the first input terminal of the feedback control module is coupled to the output terminal of the signal reference module to receive the reference signal;
      the second input terminal of the feedback control module is configured to receive a signal corresponding to a scaled signal based upon a signal at a current carrying terminal of a power transistor;
      the feedback control module is configured to provide:
         an output signal in a first state when the scaled signal is less than a threshold signal; or
         the output signal in a second state when the scaled signal at least the threshold signal;
      the output terminal of the feedback control module is configured to be coupled to a control electrode of the power transistor;
      the feedback control module comprises:
         a first measurement module having a first input terminal, a second input terminal, an output terminal, wherein:
            the first input terminal of the first measurement module is coupled to the output terminal of the signal reference module to receive the reference signal that is a reference voltage;
            the second input terminal of the first measurement module is configured to receive the scaled signal that corresponds to a fraction of a voltage difference between current carrying terminals of the power transistor; and
            the output terminal is configured to provide an output signal in a third state or a fourth state, wherein:
               the third state corresponds to the reference voltage being greater than a second input signal on the second input terminal; and
               the fourth state corresponds to the reference voltage being less than the second input signal on the second input terminal; and
         a control signal drive module having an input terminal and an output terminal, wherein:
            the input terminal of the control signal drive module is coupled to the output terminal of the first measurement module;
            the control signal drive module is configured to provide an output signal in the first state or the second state, wherein:
               the first state being in response to the output signal from the first measurement module being in the third state; and
               the second state being in response to the output signal from the first measurement module being in the fourth state; and
            the output input terminal of the control signal drive module is configured to be coupled to the control electrode of the power transistor.

2. The electronic device of claim 1, wherein:
   the second input of the first measurement module is configured to be coupled to a first voltage divider having a first resistance ratio;
   the signal reference module further comprises a second voltage divider having a second resistance ratio; and
   the first resistance ratio and the second resistance ratio are substantially the same.

3. The electronic device of claim 2, wherein the signal reference module further comprises a current mirror and a voltage selection module, wherein the current mirror has:
   a first terminal configured to receive a bandgap-referenced voltage; and
   a second terminal coupled to the voltage selection module, wherein the second terminal is configured to output a first current based on the bandgap-referenced voltage.

4. The electronic device of claim 3, wherein the voltage selection module further comprises a multiplexer and a set of serially connected resistive elements, wherein:
   the multiplexer includes a plurality of input terminals including a first input terminal and a second input terminal;
   the first input terminal of the multiplexer is coupled to the second terminal of the current mirror;
   the second input terminal of the multiplexer is coupled to a node between two resistive elements within the set of serially connected resistive elements;
   an output terminal of the multiplexer is coupled to the output terminal of the signal reference module; and
   the multiplexer is configured to couple the output terminal of the multiplexer to any one of the plurality of input terminals of the multiplexer.

5. The electronic device of claim 3, wherein:
   the current mirror comprises a first transistor and a second transistor;
   anodes of the first transistor and the second transistor are connected to each other;
   control electrodes of the first transistor and the second transistor are connected to each other; and
   a cathode of the first transistor is coupled to the second terminal of the voltage selection module.

6. The electronic device of claim 5, wherein the signal reference module comprises a second measurement module having a first input terminal, a second input terminal, and an output terminal, wherein:
   the first input terminal of the second measurement module is configured to receive a voltage from a voltage source module;
   the second input terminal of the second measurement module is coupled to the anode of the second transistor of the current mirror; and
   the output terminal of the second measurement module is coupled to the control gates of the first transistor and the second transistor.

7. The electronic device of claim 5, wherein the signal reference module further comprises a resistive element having a first terminal and a second terminal, wherein the first terminal is coupled to the anode of the second transistor, and the second terminal is coupled to a ground terminal.

8. The electronic device of claim 1, wherein the power transistor includes an insulated gate bipolar transistor.

9. The electronic device of claim 1, wherein the second input terminal of the feedback control module is configured to be coupled to an ignition coil of an internal combustion engine.

10. A system comprising:
a transformer including a first winding and a second winding;
a power transistor including a first current carrying terminal, a second current carrying terminal, and a control electrode, wherein the first current carrying terminal is coupled to a first terminal of the first winding of the transformer;
a signal scaling module having a first terminal, and a second terminal, wherein:
the first terminal is coupled to the first current carrying terminal of the power transistor; and
the second terminal is operable to produce a scaled signal based upon a signal at the first current carrying terminal; and
a signal clamping control module comprising an input terminal and an output terminal, wherein:
the input terminal is coupled to the second terminal of the signal scaling module;
the output terminal is coupled to the control electrode of the power transistor to clamp a signal at the first current carrying terminal of the power transistor at a predetermined magnitude; and
the signal clamping control modules comprises:
a signal reference module comprising a terminal operable to produce a reference signal; and
a feedback control module comprising a first input terminal, a second input terminal, and an output terminal, wherein:
the first input terminal of the feedback control module is coupled to the terminal of the signal reference module;
the second input terminal of the feedback control module is coupled to the second terminal of the signal scaling module; and
the output terminal is coupled to the control electrode of the power transistor to clamp the signal at the first current carrying terminal of the power transistor at the predetermined magnitude.

11. The system of claim 10, wherein the power transistor includes an insulated gate bipolar transistor.

12. The system of claim 10, wherein the signal reference module further comprises a voltage selection module that is operable to allow a plurality of different voltages to be used as the reference signal with respect to a clamping voltage for the power transistor.

13. The system of claim 10, wherein the transformer includes an ignition coil for an internal combustion engine.

14. A method of using an electronic device comprising:
receiving a power supply voltage, wherein the power supply voltage is coupled to a transformer that is coupled to a power transistor;
generating a first reference voltage in response to receiving the power supply voltage, wherein generating the first reference voltage comprises generating a bandgap-referenced voltage and providing a first current to a voltage selection module, wherein the first current is based on the bandgap-referenced voltage;
receiving a first fractional voltage that is a first fraction of a first voltage difference between current carrying terminals of the power transistor;
comparing the first reference voltage to the first fractional voltage to determine a first voltage for a first control electrode signal; and
transmitting the first control electrode signal to a control electrode of the power transistor.

15. The method of claim 14, further comprising selecting a second reference voltage using the voltage selection module.

16. The method of claim 15, further comprising:
generating a second reference voltage in response to receiving the power supply voltage after selecting the second reference voltage, wherein:
generating the second reference voltage is performed after generating the first reference voltage; and
the second reference voltage is different from the first reference voltage;
receiving a second fractional voltage that is a second fraction of a second voltage difference between the current carrying terminals of the power transistor;
comparing the second reference voltage to the second fractional voltage to determine a second voltage for a second control electrode signal; and
transmitting the second control electrode signal to the control electrode of the power transistor.

17. The method of claim 14, further comprising:
activating a clamp enable signal before receiving the first fractional voltage;
activating a gate driver enable signal to turn on the power transistor before receiving the first fractional voltage; and
deactivating the gate driver enable signal to turn off the power transistor before receiving the first fractional voltage; and
wherein the clamp enable signal remains activated at least until transmitting the first control electrode signal.

18. The electronic device of claim 14, wherein the bandgap-referenced voltage corresponds to the bandgap voltage of silicon.

19. The electronic device of claim 1, wherein the signal reference module is configured to provide a time-independent reference signal.

20. The system of claim 10, wherein the signal reference module is configured to provide a time-independent reference signal.

* * * * *